(12) United States Patent
Goldman et al.

(10) Patent No.: US 8,473,168 B2
(45) Date of Patent: Jun. 25, 2013

(54) SEED PLANTER DATA ACQUISITION AND MANAGEMENT SYSTEM

(75) Inventors: Daniel M. Goldman, Des Moines, IA (US); James L. Hunter, Littleton, CO (US); Timothy P. Meyer, Des Moines, IA (US)

(73) Assignee: Pioneer Hi-Bred International, Inc., Johnston, IA (US)

( * ) Notice: Subject to any disclaimer, the term of this patent is extended or adjusted under 35 U.S.C. 154(b) by 302 days.

(21) Appl. No.: 12/855,430

(22) Filed: Aug. 12, 2010

(65) Prior Publication Data
US 2011/0046776 A1 Feb. 24, 2011

Related U.S. Application Data

(60) Provisional application No. 61/234,080, filed on Aug. 14, 2009.

(51) Int. Cl.

| | |
|---|---|
| *A01B 69/04* | (2006.01) |
| *A01B 69/08* | (2006.01) |
| *A01B 79/05* | (2006.01) |
| *A01B 79/02* | (2006.01) |
| *A01C 7/105* | (2006.01) |
| *A01C 7/107* | (2006.01) |
| *E02F 9/2045* | (2006.01) |
| *E02F 9/262* | (2006.01) |
| *G05D 1/0274* | (2006.01) |
| *G05D 1/0231* | (2006.01) |
| *G05D 1/0244* | (2006.01) |
| *G05D 1/02461* | (2006.01) |
| *A01B 69/01* | (2006.01) |

(52) U.S. Cl.
USPC ............... 701/50; 701/25; 111/200; 111/904; 111/900

(58) Field of Classification Search
USPC .......... 701/50, 1, 25, 28, 41, 55, 56; 111/200, 111/900, 904, 903
See application file for complete search history.

(56) References Cited

U.S. PATENT DOCUMENTS

| 5,646,846 A | 7/1997 | Bruce et al. |
|---|---|---|
| 5,913,915 A | 6/1999 | McQuinn |

(Continued)

FOREIGN PATENT DOCUMENTS

| EP | 1 637 026 A1 | 3/2006 |
|---|---|---|
| GB | 2 132 395 A | 7/1984 |

(Continued)

OTHER PUBLICATIONS

*AgGPS 132 Parallel Swathing Option*; Trimble (2 pgs.).

(Continued)

*Primary Examiner* — Christopher J Novosad
(74) *Attorney, Agent, or Firm* — Alston & Bird LLP

(57) ABSTRACT

The present invention provides a system and method for generating a planting profile for seeds planted in a field using a seed planter that includes a seed transfer device. In various embodiments, the planting profile may be generated via a processor that communicates with a timing device and a seed sensor. The timing device is configured to provide timestamps associated with the presence of one or more seeds on a seed carrying feature of the seed transfer device as indicated by the seed sensor. Some embodiments further comprise a speed measuring device that is configured to measure and provide to the processor a speed of the seed planter as it travels through the field. Other embodiments further comprise a second seed sensor that senses seeds after exiting from the drop tube.

25 Claims, 3 Drawing Sheets

U.S. PATENT DOCUMENTS

| | | | |
|---|---|---|---|
| 5,955,973 | A | 9/1999 | Anderson |
| 6,089,743 | A | 7/2000 | McQuinn |
| 6,122,581 | A | 9/2000 | McQuinn |
| 6,199,000 | B1 | 3/2001 | Keller et al. |
| 6,386,128 | B1 | 5/2002 | Svoboda et al. |
| 6,505,124 | B2 | 1/2003 | Carr et al. |
| 6,505,146 | B1 | 1/2003 | Blackmer |
| 6,510,367 | B1 | 1/2003 | McQuinn |
| 6,516,271 | B2 | 2/2003 | Upadhyaya et al. |
| 6,516,733 | B1 | 2/2003 | Sauder et al. |
| 6,553,299 | B1 | 4/2003 | Keller et al. |
| 6,553,312 | B2 | 4/2003 | Upadhyaya et al. |
| 6,671,698 | B2 | 12/2003 | Pickett et al. |
| 6,672,228 | B1 | 1/2004 | Groelz et al. |
| 6,760,654 | B2 | 7/2004 | Beck |
| 6,810,315 | B2 | 10/2004 | Cessac |
| 6,941,225 | B2 | 9/2005 | Upadhyaya et al. |
| 6,997,120 | B2 | 2/2006 | Gabriel |
| 7,197,992 | B2 | 4/2007 | Gabriel |
| 2003/0159633 | A1 | 8/2003 | Upadhyaya et al. |
| 2003/0187560 | A1 | 10/2003 | Keller et al. |
| 2006/0278143 | A1 | 12/2006 | Deppermann et al. |
| 2007/0131152 | A1 | 6/2007 | Gabriel |
| 2008/0004778 | A1 | 1/2008 | Rekow |
| 2008/0006627 | A1 | 1/2008 | Goldman et al. |
| 2009/0010750 | A1 | 1/2009 | Goldman et al. |
| 2009/0077932 | A1 | 3/2009 | Cope et al. |
| 2011/0113030 | A1 | 5/2011 | Hunter et al. |

FOREIGN PATENT DOCUMENTS

| | | |
|---|---|---|
| WO | WO-2007/136606 | 11/2007 |
| WO | WO 2010/021824 A1 | 2/2010 |

OTHER PUBLICATIONS

International Search Report and Written Opinion for International Application No. PCT/US2010/045468 mailed Dec. 29, 2010.

SEED PLANTER DATA ACQUISITION AND MANAGEMENT SYSTEM

CROSS REFERENCE TO RELATED APPLICATIONS

The present application claims priority from U.S. Provisional Application No. 61/234,080, filed Aug. 14, 2009, which is hereby incorporated herein in its entirety by reference.

FIELD OF THE INVENTION

The various embodiments of the present invention relate generally to seed planting systems and methods. More specifically, embodiments of the present invention provide systems and methods for gathering seed planting data and for optimizing seed planting operations.

BACKGROUND OF THE INVENTION

It is typical for a company in the agricultural seed industry to generate one or more research plots in order to evaluate certain seed varieties. Such seed varieties may include, but need not be limited to, seeds from a specific source, genotype, population, and/or breeding line. In such a manner, researchers may evaluate characteristics of the plants growing in the research plot, as well as characteristics of any crops produced from the plants. In some instances these characteristics may be compared to plants grown from different seed varieties in the research plot. Thus, certain experiments may require a researcher to plant many different seed varieties in the research plot at approximately the same time. Additionally, a researcher may desire to plant various seed varieties in relatively close proximity to other seed varieties.

Traditional research planting includes a substantial portion of manual processes. Conventional techniques require seed samples to be packaged in small paper coin envelopes, which are manually opened at the desired planting locations in order to deposit the seed samples for planting research plots. In many instances this is accomplished by using a mobile planter transport device that transports a research seed planter configured to carry a seed planting operator. For single row planting, a typical research seed planter may include a planting operator seat, a seed storage area, and a seed metering system that leads to a drop tube. In such a manner, a seed planting operator may ride along with the research seed planter as the research seed planter is pulled through the research plot. Seeds that are to be planted in the research plot are contained in coin envelopes that are stored in the seed storage area. As the research seed planting device is transported through the research plot, the seed planting operator accesses the coin envelopes and opens the envelopes into seed funnels that deliver the seeds to seed metering systems. The seed metering systems then release individual seeds through the drop tubes and into the research plot. In order to track the location of the planted seeds, some seed planters incorporate a sensor at the drop tube to sense a passing seed.

These systems and processes are susceptible to various forms of error. For example, the drop tube sensor is very susceptible to false triggering as the movement of the seed planter through the plot often stirs up debris into the drop tube. Additionally, a typical drop tube sensor may not sense when two or more seeds are released by the metering system where one seed was intended (i.e., a multiple seed condition, such as a "double" or "triple" seed condition).

As a result, there is a need in the art for a system and method for determining planted seed locations within an agricultural research plot. The system and method should reduce the incidence of false triggers and improve the detection of multiple seed conditions. Consequently, the system should improve seed planting location, spacing, and count determinations thus allowing more accurate seed planting maps to be developed.

SUMMARY OF VARIOUS EMBODIMENTS

The present invention addresses the above needs and achieves other advantages by providing various embodiments of a system and method for developing a planting profile for a field. In one embodiment, a system is provided that generally comprises a seed planter, a seed sensor, a timing device, and a processor in communication with the timing device and the seed sensor. The seed planter is configured to travel through a field and release a plurality of seeds into the field, and includes a seed transfer device having at least one seed carrying feature configured to carry one or more seeds. The seed sensor is configured to sense the presence of one or more seeds on the seed carrying feature and to provide corresponding indications. The timing device is configured to provide timestamps associated with the presence of the seeds on the seed carrying feature as indicated by the seed sensor. The processor is configured to generate a planting profile for the seeds in the field, wherein the planting profile comprises the timestamps associated with the presence of the seeds on the seed carrying feature.

Some embodiments may further comprise a speed measuring device configured to measure and provide to the processor a speed of the seed planter as it travels through the field, wherein the planting profile may comprise spacing of the plurality of seeds planted in the field based on a speed of the seed planter and the timestamps associated with the presence of the seeds on the seed carrying feature. In some embodiments, the planting profile may comprise a map of the relative locations of the plurality of seeds in the field based on a speed of the seed planter and the timestamps associated with the presence of the seeds on the seed carrying feature. In some embodiments, the processor may be configured to receive an initial parameter, and the planting profile may comprise a map of the absolute locations of the plurality of seeds in the field based on a speed of the seed planter, the timestamps associated with the presence of the seeds on the seed carrying feature, and the initial parameter. In some embodiments, the initial parameter may comprise a spatial location of the first or last planted seed in the field. In some embodiments, the initial parameter may comprise an initial or final spatial location of the seed planter in the field. In some embodiments, the speed measuring device may comprise a device selected from the group consisting of a speedometer, a ground-based telemetry system, an encoder system, a linear or rotary position sensor, a cable system, a satellite navigation system, and combinations thereof. In some embodiments, the seed transfer device may comprise a seed metering device. In some embodiments, at least one seed may be contained in a seed package and the system may further comprise a package sensor. In some embodiments, the package sensor may be configured for reading information from the seed package. In some embodiments, the seed package may be carried by a seed package carrier, and the package sensor may be configured for reading information from the seed package carrier. In some embodiments, the package sensor may comprise a device selected from the group consisting of a bar code reader, an OCR reader, an RFID reader, and combinations thereof.

Some embodiments may further comprise a second seed sensor configured to sense the presence of one or more seeds released into the field and to provide corresponding indications, and the timing device may be configured to provide timestamps associated with the presence of the seeds released into the field as indicated by the second seed sensor, wherein the planting profile may comprise a map of the relative locations of the plurality of seeds in the field based on a speed of the seed planter, the timestamps associated with the presence of the seeds on the seed carrying feature, and the timestamps associated with the presence of the seeds released into the field. In some embodiments, at least one of the seed sensors may be a non-optical sensor, and one or more seeds of the plurality of seeds may be associated with an element configured to be sensed by the non-optical sensor. In some embodiments, the non-optical seed sensor may be an inductive proximity or Hall-effect sensor, and the one or more seeds may be coated with a metallic indicator substance. In some embodiments, the processor may be configured to receive an initial parameter, and the planting profile may comprise a map of the absolute locations of the plurality of seeds in the field based on a speed of the seed planter, the timestamps associated with the presence of the seeds on the seed carrying feature, the timestamps associated with the presence of the seeds released into the field, and the initial parameter.

In another embodiment, a method is provided for developing a planting profile for a field. In one embodiment, the method generally comprises releasing a plurality of seeds into a field while moving a seed planter that includes a seed transfer device through the field, the seed transfer device including at least one seed carrying feature configured to carry one or more seeds, sensing the presence of one or more seeds on the seed carrying feature with a seed sensor and providing corresponding indications to a processor, generating timestamps associated with the presence of the seeds on the seed carrying feature via a timing device and providing the timestamps to the processor, and generating a plating profile via the processor. The planting profile may comprise the timestamps associated with the presence of the seeds on the seed carrying feature. Some embodiments may further comprise measuring a speed of the planter as it moves through the field and providing the speed to the processor, wherein the planting profile may comprise spacing of the plurality of seeds planted in the field based on a speed of the seed planter and the timestamps associated with the presence of the seeds on the seed carrying feature. In another embodiment, the planting profile may comprise a map of the relative locations of the plurality of seeds in the field based on a speed of the seed planter and the timestamps associated with the presence of the seeds on the seed carrying feature. Some embodiments may further comprise providing the processor with an initial parameter, wherein the planting profile may comprise a map of the absolute locations of the plurality of seeds in the field based on a speed of the seed planter, the timestamps associated with the presence of the seeds on the seed carrying feature, and the initial parameter. Some embodiments may further comprise providing a seed package containing at least one seed. Some embodiments may further comprise reading information from the seed package via a seed package sensor. Some embodiments may further comprise providing a seed package carrier configured to carry the seed package, and reading information from the seed package carrier via a seed package sensor.

Some embodiments may further comprise sensing the presence of one or more seeds released into the field with a second seed sensor and providing corresponding indications to the processor, and the timing device may be configured to provide timestamps associated with the presence of the seeds released into the field as indicated by the second seed sensor, wherein the planting profile may comprise a map of the relative locations of the plurality of seeds in the field based on a speed of the seed planter, the timestamps associated with the presence of the seeds on the seed carrying feature, and the timestamps associated with the presence of the seeds released into the field. Some embodiments further comprise providing the processor with an initial parameter, and the planting profile may comprise a map of the absolute locations of the plurality of seeds in the field based on a speed of the seed planter, the timestamps associated with the presence of the seeds on the seed carrying feature, the timestamps associated with the presence of the seeds released into the field, and the initial parameter.

BRIEF DESCRIPTION OF THE DRAWINGS

Figure 1:
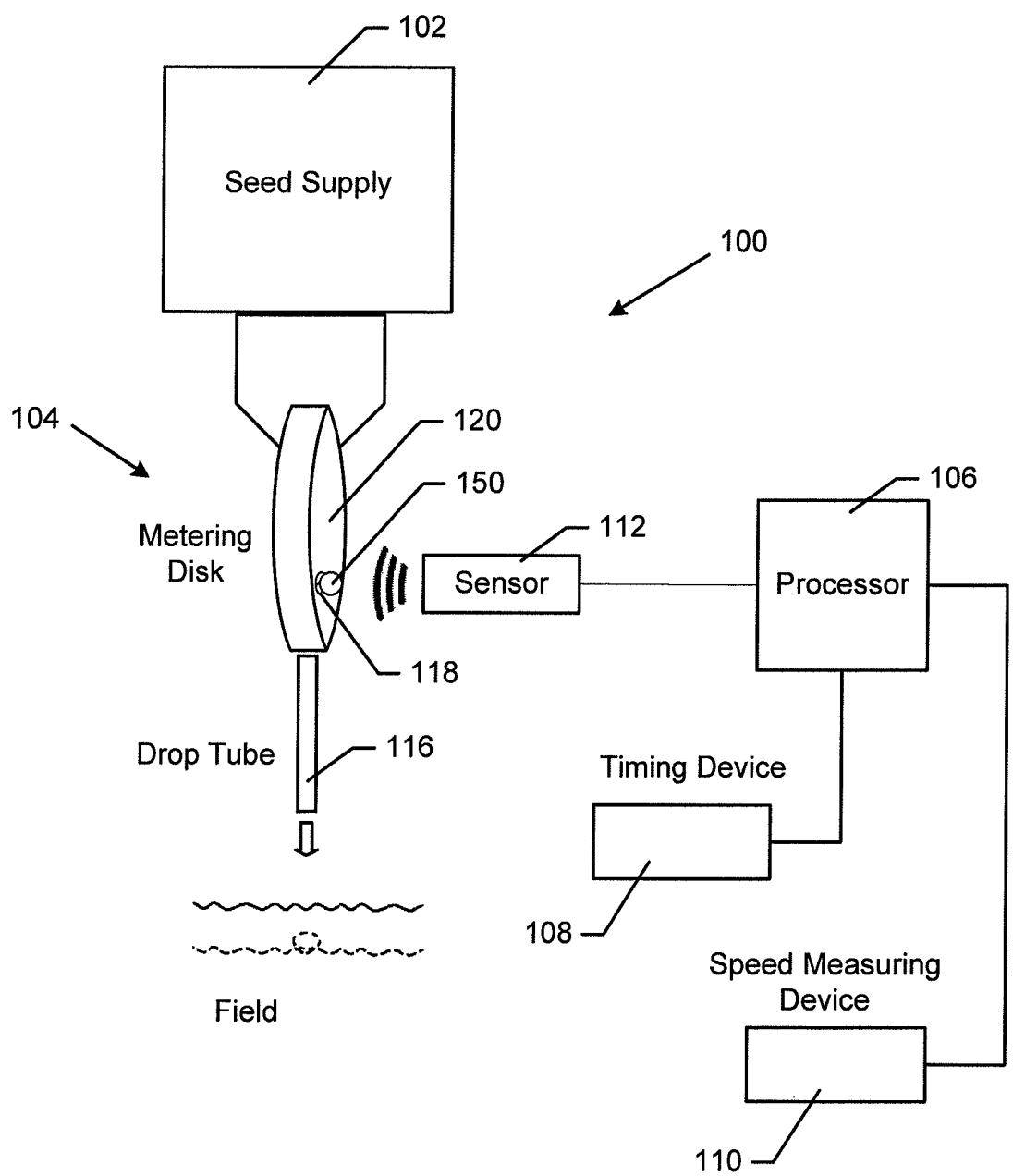
Figure 2:
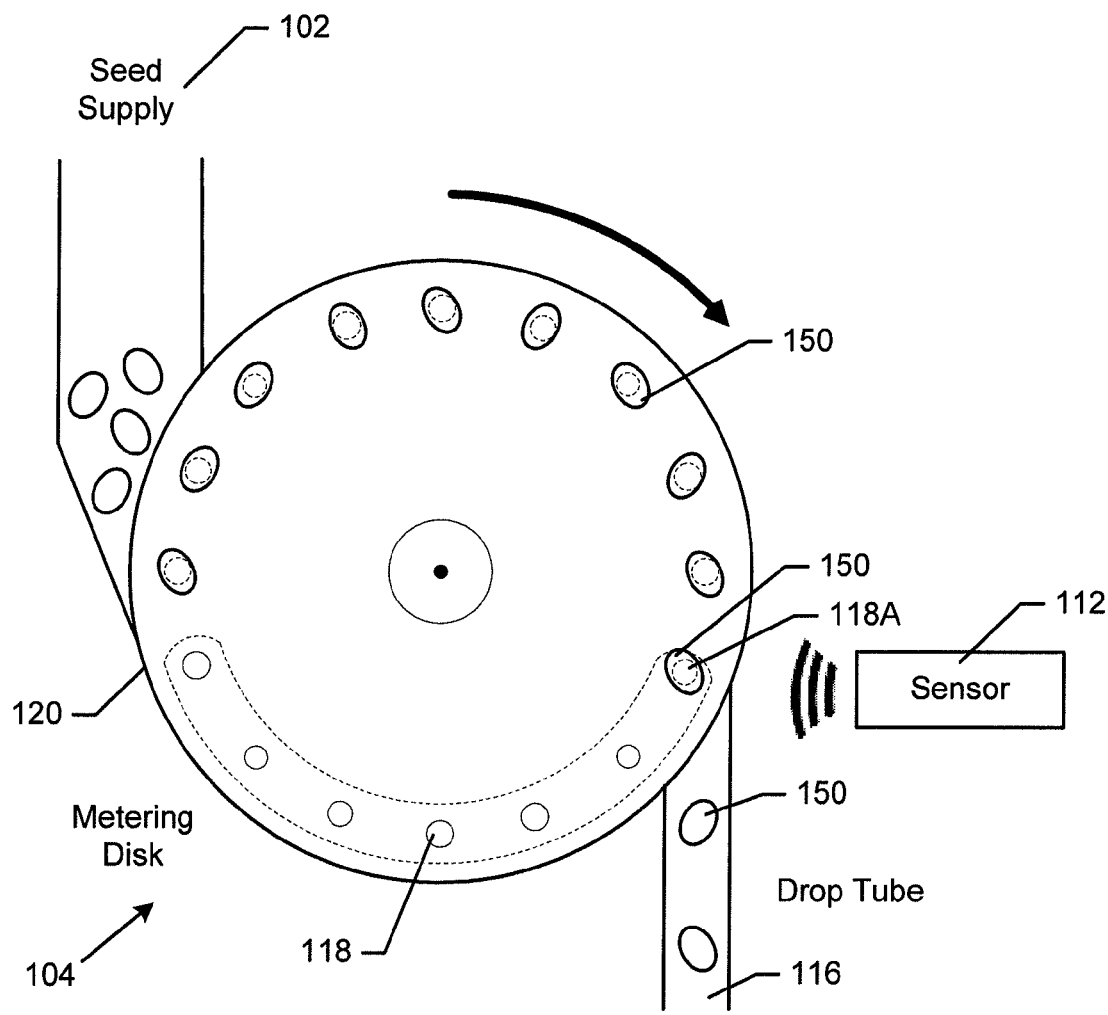
Figure 3:
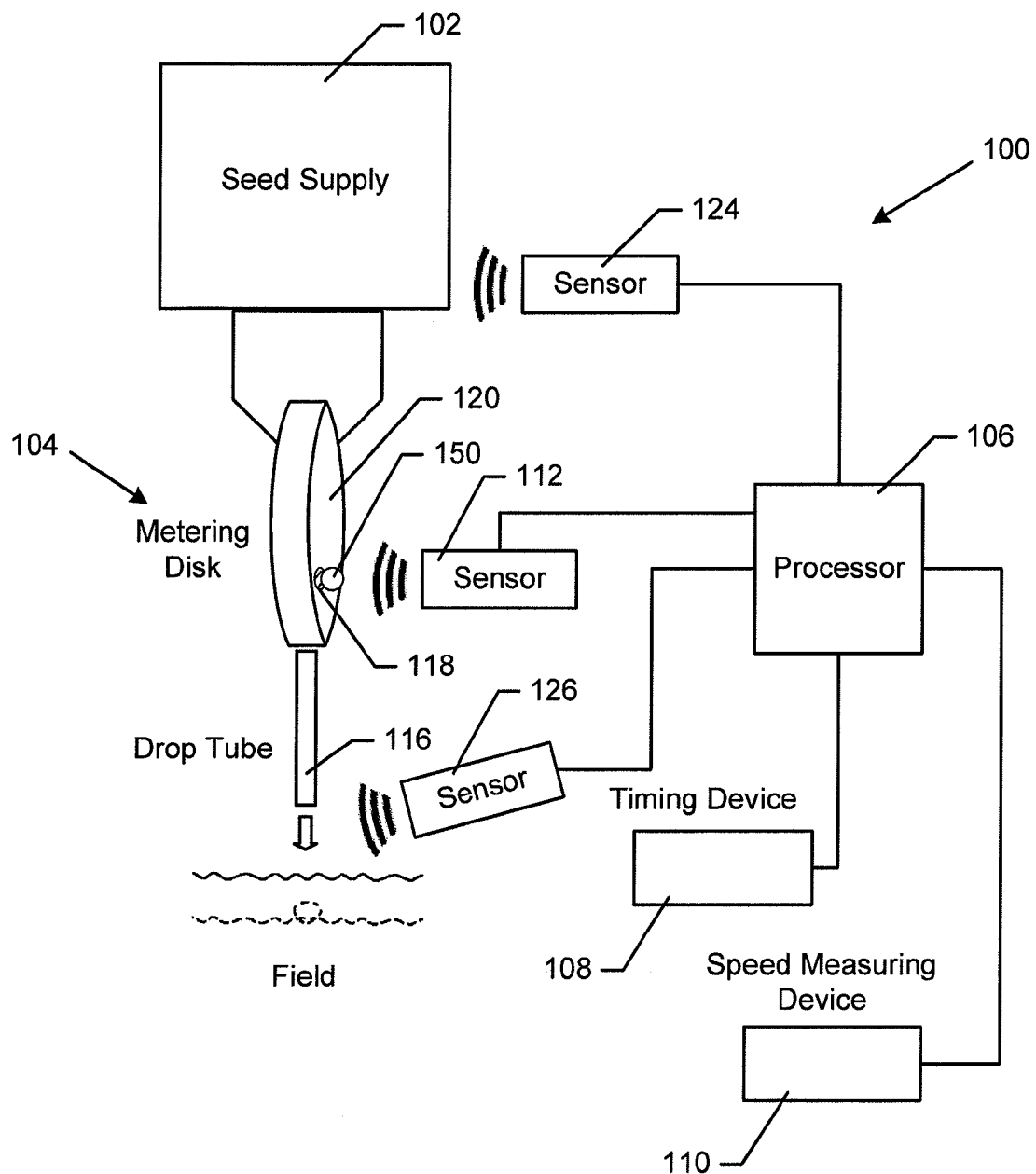

Having thus described the invention in general terms, reference will now be made to the accompanying drawings, which are not necessarily drawn to scale, and wherein:

FIG. 1 shows a schematic drawing of portions a research seed planter in accordance with an exemplary embodiment of the present invention;

FIG. 2 shows a schematic drawing of a seed metering device including a seed metering disk, as well as a seed sensor and drop tube in accordance with an exemplary embodiment of the present invention; and FIG. 3 shows a schematic drawing of portions a research seed planter in accordance with another exemplary embodiment of the present invention.

DETAILED DESCRIPTION

The present invention now will be described more fully hereinafter with reference to the accompanying drawings, in which some, but not all embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout.

FIG. 1 shows a schematic drawing of portions of a seed planter 100 in accordance with an exemplary embodiment of the present invention. In the depicted embodiment, the seed planter 100 is a research seed planter, however in other embodiments the seed planter may be any other type of seed planter, including, but not limited to, a commercial seed planter. In general, the planter 100 of the depicted embodiment includes a seed supply 102, a seed transfer device 104, a processor 106, a timing device 108, and a speed measuring device 110. The seed planter 100 of the depicted embodiment also includes a seed sensor 112. In the depicted embodiment, the planter 100 is configured to be pulled behind a mobile planter transport device operated by an operator. It should be noted that in various embodiments, a planter 100 in accordance with the present invention may be configured to plant any number of rows of seeds as is commonly known in the art. Examples may include, but need not be limited to, planters configured to plant as many as sixteen rows or more of seeds, or planters configured to plant as few as one row of seeds. Additionally, although in the depicted embodiment the planter 100 is configured to be transported via a mobile planter transport device (such as, for example, a farm tractor, an all terrain vehicle, one or more horses, a multipurpose vehicle such as a Unimog or Humvee, etc.), in other embodiments the planter 100 may be self-propelled, such as, for example, by including an integrated transporting mechanism or device.

In the depicted embodiment, the seed transfer device 104 is configured to release individual seeds 150 through a drop tube 116 and into a field. It should be noted that in various embodiments of the present invention the term "field" and other forms thereof may represent a single plot, or multiple plots. Thus, a field may represent any area of land into which one or more seeds are planted. In some embodiments, a field may include one or more research plots. In other embodiments, a field may represent one or more commercial plots. In still other embodiments, a field may represent a combination of one or more research and commercial plots.

It should also be noted that the term "seed transfer device" and other forms thereof may represent any device configured to transfer seeds from a seed supply for the purpose of planting the seeds in a field. Such devices may include, for example, seed transfer devices that are configured to release multiple seeds simultaneously into the same area of a field, as well as, for example, seed transfer devices that are configured to singulate seeds such that individual seeds are planted in respective areas of a field. Regarding the latter group, these may encompass a variety of seed transfer devices including, but not limited to, vacuum-type seed metering devices (such as, for example, vacuum-type seed metering devices available from Seed Research Equipment Solutions, LLC of South Hutchinson, Kans.), as well as cone-type seed metering devices (such as, for example, cone-type seed metering devices available from ALMACO of Nevada, Iowa).

In the depicted embodiment, the seed transfer device 104 is a vacuum-type seed metering device comprising a metering disk 120 that includes a plurality of seed carrying features 118 disposed radially about the metering disk 120 and proximate an outer perimeter of the metering disk 120. As a result, the seed transfer device 104 of the depicted embodiment is configured to singulate and transfer individual seeds proximate a drop tube 116, where the individual seeds are released into the field. It should be noted that although the seed transfer device 104 of the depicted embodiment is shown having a generally vertical orientation, the present invention encompasses seed transfer devices having any orientation, including, but not limited to, seed transfer devices having a generally horizontal orientation.

In the depicted embodiment, the metering disk 120 is configured to rotate past the seed supply 102 in the direction shown so as to singulate the seeds 150 by picking up individual seeds 150 and delivering the seeds 150 to the drop tube 116. In various embodiments the seeds 150 may be released into the drop tube 116 in a variety of ways, including but not limited to, mechanically removing the seeds 150 from a seed carrying feature 118 or interrupting the negative pressure at a seed carrying feature 118 positioned proximate the drop tube 116. In the depicted embodiment, the negative pressure of a seed carrying feature 118 is interrupted when it is positioned above the drop tube 116. The seed metering disk 120 of the depicted embodiment (shown in more detail in FIG. 2) includes a plurality of seed carrying features 118 that are configured to pick up individual seeds 150 and deliver the seeds 150 to the drop tube 116. In the depicted embodiment the seed carrying features 118 comprise small apertures that are sized to carry individual seeds 150. The apertures are in communication with a vacuum (not shown) so as to create localized areas of negative pressure at the apertures. In such a manner, individual seeds 150 may be picked up from the seed supply 102 and delivered to the drop tube 116. It should be noted that in various other embodiments, the term "seed carrying feature" and other forms thereof may represent any other feature configured to deliver seeds and need not represent apertures. For example, some embodiments may utilize a seed transfer device in the form of a cone-type seed metering device, wherein the seed carrying features may represent individual pockets or grooves disposed about the periphery of the cone.

Referring back to FIG. 1, in the depicted embodiment, the processor 106 is in communication with and receives indications, signals, and/or data from the timing device 108, speed measuring device 110, and seed sensor 112. In the depicted embodiment, the timing device 108 is configured to generate timestamps and provide the timestamps to the processor 106. In various embodiments, the timing device 108 may include, but need not be limited to, an electronic timer, a programmable logic controller (PLC), a personal computer (PC), a processor device, etc. In some embodiments, however, the timing device may be part of the seed sensor 112. In other embodiments, the timing device may be configured to generate time differences between signals and to provide the time differences to the processor 106.

Although some embodiments may not include a speed measuring device, in the depicted embodiment, the speed measuring device 110 is configured to measure a speed of the planter 100 as it travels through the field and to provide the speed of the planter 100 to the processor 106. In some embodiments, a plurality of instantaneous speeds may be measured and provided to the processor 106. In other embodiments, the speed measuring device 110 may provide speed ranges, averages, or other statistical manipulations of the speed of the planter 100 as it travels through the field. In various embodiments the speed measuring device 110 may comprise, but need not be limited to, one or more accelerometers, one or more velocimeters (including, but not limited to, laser velocimeters), one or more speedometers (including, but not limited to, eddy current or electronic speedometers), one or more cable systems, one or more dead reckoning systems, one or more encoders, one or more linear or rotary position sensors, one or more satellite navigation systems, one or more ground-based laser or other telemetry systems, and combinations thereof. An example of a cable system may include, but need not be limited to, a cable that is wound about a spool and that includes position indicator buttons placed periodically along the length thereof. As a seed planter 100 is moved through the field, the cable is unwound and the position indicator buttons are sensed by a check-head or other sensing device. An example of a satellite navigation system may include, but need not be limited to, the global positioning system (GPS) or the International Global Navigation Satellite System (GNSS) Service (IGS). GPS systems enable very accurate location determination or position fixing by utilizing measurements of precise timing signals broadcast from a constellation of more than two dozen GPS satellites in orbit around the earth. Locations can be determined, for example, in terms of longitude, latitude, and altitude regardless of time, weather and position on the earth. Other satellite navigation systems include, but need not be limited to, International Global Navigation Satellite Systems (GNSS) Service (IGS), which have incorporated NAVSTAR satellites of the United States and GLONASS satellites from Russia along with additional satellite constellations to provide robust navigation capability. In general, IGS provides increased precision in location determination and enables the utilization of enhancements in the capabilities of satellite navigation system devices. A Differential Global Positioning System (DGPS) is an enhancement of GPS that incorporates additional ground-based reference stations that allow the calculation of differences between the measured GPS positions and the ground-based fixed locations so that corrections can be made for improved accuracy. Accordingly, it should be understood that, as used herein, the term satellite navigation system is meant to encompass any of a number of different systems including, for example, GPS, IGS, GNSS, NAVSTAR, GLONASS, DGPS, etc.

In the depicted embodiment, the seed sensor 112 senses the presence of a seed 150 at a seed carrying feature 118 of the seed transfer device 104 rather than in the drop tube 116. In such a manner, the seed sensor 112 may provide improved performance over sensors that sense seeds through the drop tube. Improved performance may include improved performance relating to sensing "multiples" (where two or more seeds 150 are positioned side-by-side on a seed carrying feature 118A, such as "doubles" and "triples"), and "skips" (where no seed occupies the seed carrying feature 118A). In the depicted embodiment, the seed sensor 112 is an optical sensor. Suitable optical sensors may include, but need not be limited to, various beam sensors or retro-reflective sensors. In other embodiments the seed sensor 112 may be any other type of sensor configured to sense the presence or absence of a seed. For example, in some embodiments, the seed sensor 112 may be a capacitive proximity sensor. In other embodiments, the seed sensor 112 may be another type of sensor. For example, in some embodiments, one or more seeds 150 may associated (such as being pre-coated, conditioned, treated, or coupled) with an element (such as an item, material, coating, or substance) that may be sensed by a non-optical sensor. For example, in some embodiments one or more seeds 150 may be coated with a metallic indicator substance that may be sensed by an inductive proximity or Hall-effect sensor.

In the depicted embodiment, the seed sensor 112 senses the presence of a seed 150 at a seed carrying feature 118A that is positioned directly above the drop tube 116. In such a manner, the sensor 112 senses that a seed 150 is present just prior to being deflected into the drop tube 116. As will be discussed in more detail below, in other embodiments the seed sensor 112 may be positioned in another location proximate the metering disk 120 and/or additional seed sensors may be employed in various other locations. Because in some embodiments the field may be subject to debris and/or other objects that may be stirred up by the movement and operation of the planter 100, the seed sensor 112 may be a background/foreground suppression sensor. A suitable suppression sensor may include, but need not be limited to, a model 44B Allen-Bradley mechanically adjustable background suppression photoelectric sensor available from Rockwell Automation.

The seed sensor 112 of the depicted embodiment is configured to output a signal and/or data to a PLC that communicates with the processor 106. In the depicted embodiment, the processor 106 is a processor of a personal computer (PC), however in various embodiments the processor 106 may be embodied in a number of different ways. For example, the processor 106 may be embodied as various processing means such as a processing element, a coprocessor, a controller or various other processing devices including integrated circuits such as, for example, an ASIC (application specific integrated circuit), an FPGA (field programmable gate array), a hardware accelerator, or the like. In an exemplary embodiment, the processor 106 may be configured to execute instructions stored in a memory device or otherwise accessible to the processor 106. Alternatively or additionally, the processor 106 may be configured to execute hard coded functionality. As such, whether configured by hardware or software methods, or by a combination thereof, the processor 106 may represent an entity (e.g., physically embodied in circuitry) capable of performing operations according to embodiments of the present invention while configured accordingly. Thus, for example, when the processor 106 is embodied as an ASIC, FPGA or the like, the processor 106 may be specifically configured hardware for conducting the operations described herein. Alternatively, as another example, when the processor 106 is embodied as an executor of software instructions, the instructions may specifically configure the processor 106 to perform the algorithms and/or operations described herein when the instructions are executed. However, in some cases, the processor 106 may be a processor of a specific device (e.g., a mobile terminal) adapted for employing embodiments of the present invention by further configuration of the processor 106 by instructions for performing the algorithms and/or operations described herein. The processor 106 may include, among other things, a clock and logic gates configured to support operation of the processor 106.

In general, the present invention is configured to generate a "planting profile" for a plurality of seeds planted in a field. In various embodiments, the planting profile may represent any data associated with the plurality of seeds wherein the data is gathered or generated based on indications, signals and/or data received from one or more components of the system. For example, in some embodiments the planting profile may represent respective timestamps for the plurality of seeds that are provided by a timing device, wherein the timestamps are associated with respective indications from a seed sensor of the presence of the seeds on a seed carrying feature of a seed transfer device. In other embodiments, the planting profile may represent spacing of the plurality of seeds planted in the field based on a speed of the seed planter as provided by a speed measuring device and timestamps provided by a timing device that are associated with respective indications from a seed sensor of the presence of the plurality of seeds on a seed carrying feature of a seed transfer device. In other embodiments, the planting profile may represent a map of the relative locations of the plurality of seeds based on a speed of the seed planter as provided by a speed measuring device and timestamps provided by a timing device that are associated with respective indications from a seed sensor of the presence of the plurality of seeds on a seed carrying feature of a seed transfer device. In the depicted embodiment, the processor 106 is configured to generate a planting profile that comprises a map representing an "absolute" location of each released seed 150 based on a speed of the seed planter 100 as provided by the speed measuring device 110, timestamps provided by the timing device 108 that are associated with respective indications from the seed sensor 112 of the presence of the plurality of seeds 150 on the seed carrying feature 118A of the seed transfer device 104, and an initial parameter.

In general, the planting profile of the depicted embodiment, which comprises a map of the seeds 150 planted in the field, may be generated as follows: For each seed 150 planted in the field, the seed sensor 112 is configured to provide an indication that the seed 150 is present at the seed carrying feature 118A proximate the seed sensor 112. For each seed present indication, the processor 106 may then associate with it a timestamp provided by the timing device 108 for each successive seed 150. Each timestamp (or a group of timestamps) may then be correlated with an instantaneous speed (or average speed) of the planter 100 as provided by the speed measuring device 110 to determine the relative positions of the planted seeds 150. In the depicted embodiment, the processor 106 is provided with a spatial location of the first planted seed 150 in the field as the initial parameter. As the planter 100 moves through the field, the processor 106 gathers timestamps that are associated with a speed of the planter 100 for the successive seeds 150. Given the timestamps and the speed of the planter 100 for the successive seeds 150, the processor 106 may then generate a map that represents the absolute spatial locations of the seeds 150 planted in the field.

It should be noted that in some embodiments, a map may be generated at a later time such as, for example, through post-processing of planting profile data, while in other embodiments the map may be generated "on the fly." In some embodiments, the processor 106 may compare the as-planted map with a research map plan in real time. As a result, the system and method of the present invention may also be used to provide real time data to an operator relating to planting performance, thereby allowing improved fault detection and correction. Additionally, in some embodiments the processor 106 may receive feedback regarding seed drop timing or skips or multiples occurring at the seed metering device 104. In such a manner, various variables such as the ground speed of the planter 100 and the amount of negative pressure existing at the apertures 118 may be adjusted. In addition, feedback may be provided to the operator to indicate that the operator should speed up or slow down the seed planter 100. For example, some seed planters have an approximate optimum ground speed, above which or below which performance of the seed transfer device may suffer. Thus, embodiments in which such feedback may be provided to the operator may allow the operator to maintain an optimum speed of the seed planter.

In the depicted embodiment the processor 106 is initially provided with the spatial coordinates ($X_0$ and $Y_0$) of the first seed 150 planted in the field, which may be assigned a release timestamp of $t_0$. The processor 106 then determines the coordinates ($X_1$ and $Y_1$) of the next seed 150 planted in the field by calculating its position given the relative difference between the release timestamp of the first seed ($t_0$) and the release timestamp of the next seed ($t_1$), as well as the speed of the planting device represented by a rate of change in distance between the timestamps (e.g., meters per second). The processor 106 then determines the coordinates ($X_2$ and $Y_2$) of the following seed 150 planted in the field by calculating its position given the relative difference between the release timestamp of the following seed ($t_2$) and the release timestamp of the previous seed ($t_1$), as well as the speed of the planter. This process is then repeated for each successive seed planted in the row.

For some embodiments, depending on the path taken by the planter 100 through the field, this may be sufficient for generating a planting profile comprising a map of the planted seeds 150 in the field. For other embodiments, such as embodiments wherein the planter 100 makes multiple parallel passes through the field, a width of the planter 100 may be known to the processor 106 such that the processor 106 may estimate the coordinates in a lateral direction of each successive row of seeds through the field. In various embodiments, an autosteering system (such as for example, an AgGPS 132 Parallel Swathing Option available from Trimble Navigation Limited of Sunnyvale, Calif.) may be employed to control the position of the seed planter 100 during planting passes through the field. It should be noted that in some embodiments, the processor 106 may also be provided with the spatial coordinates of the last seed planted in the field. In such embodiments, the processor 106 may interpolate the positions of the intervening seeds 150 given the spatial coordinates of the first and last seeds 150 in the field and given the respective release timestamps and the speed of the planter as described above.

Because each seed 150 will not be received into the ground instantaneously with its associated timestamp, an adjustment parameter may be used by the processor 106 to adjust the calculated positions of the planted seeds 150. In effect, the adjustment parameter may represent a delay to compensate for the time difference from when a seed 150 is present at the seed carrying feature 118A proximate the seed sensor 112 and when the seed 150 is received into the ground. In various embodiments, the adjustment parameter may also be a function of the speed of the planter 100 as the planter 100 moves through the field. In some embodiments, the seed sensor 112 may be positioned at other positions proximate the seed metering device 104. As such, the adjustment parameter may be increased or decreased to accommodate the position of the seed sensor 112.

FIG. 3 shows a schematic drawing of portions a research seed planter 100 in accordance with another exemplary embodiment of the present invention. The embodiment of FIG. 3 includes similar components as those shown in FIG. 1 and as described above. In particular, the research seed planter 100 includes a seed supply 102, a seed transfer device 104, a processor 106, a timing device 108, a speed measuring device 110, and a seed sensor 112. As with the embodiment depicted in FIG. 1, the seed transfer device 104 is configured to release individual seeds 150 through a drop tube 116 into a field. Although in other embodiments the seed transfer device 104 may represent any device configured to transfer seeds from a seed supply 150 for the purpose of planting the seeds in field, in the depicted embodiment the seed transfer device 104 is vertically oriented vacuum-type seed metering device comprising a metering disk 120 that is configured to rotate past the seed supply 102 so as to singulate the seeds 150 by picking up individual seeds 150 and delivering the seeds 150 to the drop tube 116.

Although in some embodiments, the seed supply 102 may receive a bulk sample of seeds 150, in the embodiment depicted in FIG. 3, the seed supply 102 comprises one or more seed packages. The depicted embodiment also includes a seed package sensor 124. In various embodiments, the seed package sensor 124 may be included for sensing information pertaining to seed packages that may be released into the seed metering device 104. Examples of information pertaining to a seed package may include, but are not limited to, the type(s) of seed(s) contained in the seed package, the type(s) of plant (s) intended to germinate from the seed(s) in the seed package, the source of the seed(s) (such as, for example, the producing company, country, or other lot information), the number of seeds included in the seed package, and/or any additive(s) included with the seed(s). For the purpose of the current specification and appended claims and drawings, the "type" of plant may include, but is not limited to, any plant species, varieties of plant species, hybrids of plant species, or plants having one or more specific value-added traits, whether derived through conventional breeding and/or transgenic modification. It should be noted that in some embodiments, one or more seed packages may be carried by a seed package carrier. In such embodiments, the seed package sensor 124 may be configured to read information from the seed carrier.

In various embodiments, seed packages may be configured in any manner. An example of a seed package having a hinged design is described in U.S. Patent Application Publication No. 2008/0006627, which is hereby incorporated by reference in its entirety. An example of a seed package having another design is described in U.S. Patent Application Publication No. 2009/0077932, which is also hereby incorporated by reference in its entirety. In various embodiments, seed packages may be stored in the seed supply 102 and, when desired, opened such that the seed or seeds contained therein may be released into the seed metering device 104. In various embodiments, seed packages may be opened in any manner. An example of a method of opening a seed package is described in U.S. Patent Application Publication No. 2009/0010750, which is hereby incorporated by reference in its entirety.

In the depicted embodiment, the seed package sensor 124 is an electronic reader configured to read identification information relating to seeds 150 contained in a package assembly. In various embodiments, the seed package sensor 124 may be any device capable of sensing information from the seed package, including, but not limited to, a barcode scanner capable of reading one or more barcodes associated with the seed package, an optical character recognition (OCR) reader capable of reading human-readable information associated with the seed package, a radio frequency identification (RFID) reader capable of identifying an RFID transponder associated with the seed package, and/or any combination of the above. In such a manner, a planting profile generated by the processor 106 may include information relating to the identity of the seeds 150 planted in various portions of the field.

In addition to seed sensor 112, which is configured to sense the presence of a seed 150 at a seed carrying feature 118 directly above the drop tube 116, the depicted embodiment also includes a second seed sensor 126. Seed sensor 126 is configured to sense the presence of a seed 150 released into the field. In such a manner, the second seed sensor 126 may be positioned so that it senses seeds 150 as they exit the seed drop tube 116. In other embodiments, the second seed sensor 126 may be positioned so that it senses an area of the ground below the drop tube 116 so as to sense seeds 150 after they have been planted in the ground. Thus, in various embodiments, the processor 106 may also receive an indication from the other seed sensor 126 that a seed 150 has been released into the field. In addition, the processor 106 may associate a timestamp from the timing device 108 with the indication of the presence of a seed 150 received into the field. In such embodiments, the processor 106 may also utilize these timestamps to further interpolate the positions of the planted seeds 150 generated by the timestamp associated with the presence of the seeds at the seed carrying feature 118A, a speed of the planter, and the initial parameter as similarly described above. Because the depicted embodiment includes both the first seed sensor 112 and the second seed sensor 126, in some embodiments an expected mean delay may be determined that represents a delay between the indication from the first seed sensor 112 and when an indication would normally be expected to be received from the second seed sensor 126. In such a manner, readings outside a statistically defined range could be disregarded by the processor 106 as they may be interpreted as debris rather than a seed. In various embodiments, the second seed sensor 126 may also be a photoelectric sensor, however in other embodiments the second seed sensor 126 may be any sensor configured for sensing the presence or absence of a seed as described above. In some embodiments, one or more seeds 150 may be associated with an element that may be sensed by a non-optical sensor. For example, in some embodiments, one or more seeds 150 may be coated with a metallic indicator substance that may be sensed by an inductive proximity or Hall-effect sensor. In other embodiments, one or more seeds 150 may be associated with an element that may be sensed by a sensor through the soil after the seeds have been planted. For example, in one embodiment, a sensor may be attached to the rear of the planter 100 such that the seeds 150 may be sensed after being planted in the ground. Because in some embodiments the area surrounding the planter 100 (and especially the area below the drop tube 116) may be subject to debris and/or other objects that may be stirred up by the movement and operation of the planter 100, one or both of the seed sensors 112, 126 may be background/foreground suppression sensors, as described above. In such a manner, the sensors 112, 126 may be able to sense the presence of a seed either at the seed carrying feature 118 or in the field despite the presence of floating debris.

Many modifications and other embodiments of the invention set forth herein will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system for developing a planting profile for a field, said system comprising:
    a seed planter configured to travel through the field and release a plurality of seeds into the field, the seed planter including a seed transfer device having at least one seed carrying feature configured to carry one or more seeds;
    a seed sensor configured to sense the presence of one or more seeds on the seed carrying feature and to provide corresponding indications;
    a timing device configured to provide timestamps associated with the presence of the seeds on the seed carrying feature as indicated by the seed sensor; and
    a processor in communication with the timing device and the seed sensor, wherein the processor is configured to generate a planting profile for the seeds in the field, and wherein the planting profile comprises the timestamps associated with the presence of the seeds on the seed carrying feature, and
    the planting profile is used to create a seed map that is compared with a research map.

2. The system of claim 1, further comprising a speed measuring device configured to measure and provide to the processor a speed of the seed planter as it travels through the field, and wherein the planting profile comprises spacing of the plurality of seeds planted in the field based on a speed of the seed planter and the timestamps associated with the presence of the seeds on the seed carrying feature.

3. The system of claim 2, wherein the planting profile comprises a map of the relative locations of the plurality of seeds in the field based on a speed of the seed planter and the timestamps associated with the presence of the seeds on the seed carrying feature.

4. The system of claim 3, wherein the processor is configured to receive an initial parameter, and wherein the planting profile comprises a map of the absolute locations of the plurality of seeds in the field based on a speed of the seed planter, the timestamps associated with the presence of the seeds on the seed carrying feature, and the initial parameter.

5. The system of claim 4, wherein the initial parameter comprises a spatial location of the first or last planted seed in the field.

6. The system of claim 4, wherein the initial parameter comprises an initial or final spatial location of the seed planter in the field.

7. The system of claim 2, wherein the speed measuring device comprises a device selected from the group consisting of:

a speedometer;
a ground-based telemetry system;
an encoder system;
a linear or rotary position sensor;
a cable system;
a satellite navigation system; and
combinations thereof.

8. The system of claim 2, further comprising a second seed sensor configured to sense the presence of one or more seeds released into the field and to provide corresponding indications, wherein the timing device is configured to provide timestamps associated with the presence of the seeds released into the field as indicated by the second seed sensor, and wherein the planting profile comprises a map of the relative locations of the plurality of seeds in the field based on a speed of the seed planter, the timestamps associated with the presence of the seeds on the seed carrying feature, and the timestamps associated with the presence of the seeds released into the field.

9. The system of claim 8, wherein at least one of the seed sensors is a non-optical sensor, and wherein one or more seeds of the plurality of seeds are associated with an element configured to be sensed by the non-optical sensor.

10. The system of claim 9, wherein the non-optical seed sensor is an inductive proximity or Hall-effect sensor, and wherein the one or more seeds are coated with a metallic indicator substance.

11. The system of claim 8, wherein the processor is configured to receive an initial parameter, and wherein the planting profile comprises a map of the absolute locations of the plurality of seeds in the field based on a speed of the seed planter, the timestamps associated with the presence of the seeds on the seed carrying feature, the timestamps associated with the presence of the seeds released into the field, and the initial parameter.

12. The system of claim 1, wherein the seed transfer device comprises a seed metering device.

13. The system of claim 1, wherein at least one seed is contained in a seed package and wherein the system further comprises a package sensor.

14. The system of claim 13, wherein the package sensor is configured for reading information from the seed package.

15. The system of claim 13, wherein the seed package is carried by a seed package carrier, and wherein the package sensor is configured for reading information from the seed package carrier.

16. The system of claim 13, wherein the package sensor comprises a device selected from the group consisting of:
a bar code reader;
an OCR reader;
an RFID reader; and
combinations thereof.

17. A method of developing a planting profile for a field, said method comprising:
releasing a plurality of seeds into the field while moving a seed planter that includes a seed transfer device through the field, the seed transfer device including at least one seed carrying feature configured to carry one or more seeds;
sensing the presence of one or more seeds on the seed carrying feature with a seed sensor and providing corresponding indications to a processor;
generating timestamps associated with the presence of the seeds on the seed carrying feature via a timing device and providing the timestamps to the processor;
generating a plating profile via the processor, wherein the planting profile comprises the timestamps associated with the presence of the seeds on the seed carrying feature
using the planting profile to create a seed map; and
comparing the seed map with a research map.

18. The method of claim 17, further comprising measuring a speed of the planter as it moves through the field and providing the speed to the processor, and wherein the planting profile comprises spacing of the plurality of seeds planted in the field based on a speed of the seed planter and the timestamps associated with the presence of the seeds on the seed carrying feature.

19. The method of claim 18, wherein the planting profile comprises a map of the relative locations of the plurality of seeds in the field based on a speed of the seed planter and the timestamps associated with the presence of the seeds on the seed carrying feature.

20. The method of claim 19, further comprising providing the processor with an initial parameter, and wherein the planting profile comprises a map of the absolute locations of the plurality of seeds in the field based on a speed of the seed planter, the timestamps associated with the presence of the seeds on the seed carrying feature, and the initial parameter.

21. The method of claim 18, further comprising sensing the presence of one or more seeds released into the field with a second seed sensor and providing corresponding indications to the processor, wherein the timing device is configured to provide timestamps associated with the presence of the seeds released into the field as indicated by the second seed sensor, and wherein the planting profile comprises a map of the relative locations of the plurality of seeds in the field based on a speed of the seed planter, the timestamps associated with the presence of the seeds on the seed carrying feature, and the timestamps associated with the presence of the seeds released into the field.

22. The method of claim 21, further comprising providing the processor with an initial parameter, and wherein the planting profile comprises a map of the absolute locations of the plurality of seeds in the field based on a speed of the seed planter, the timestamps associated with the presence of the seeds on the seed carrying feature, the timestamps associated with the presence of the seeds released into the field, and the initial parameter.

23. The method of claim 17, further comprising providing a seed package containing at least one seed.

24. The method of claim 23, further comprising reading information from the seed package via a seed package sensor.

25. The method of claim 23, further comprising providing a seed package carrier configured to carry the seed package, and reading information from the seed package carrier via a seed package sensor.

* * * * *